(12) United States Patent
Li et al.

(10) Patent No.: US 12,604,702 B2
(45) Date of Patent: Apr. 14, 2026

(54) CALIBRATION DEVICE

(71) Applicant: Diodes Incorporated, Plano, TX (US)

(72) Inventors: WanHui Li, Chengdu (CN); JiaWei Tai, Chengdu (CN)

(73) Assignee: Diodes Incorporated, Plano, TX (US)

( * ) Notice: Subject to any disclaimer, the term of this patent is extended or adjusted under 35 U.S.C. 154(b) by 479 days.

(21) Appl. No.: 18/369,784

(22) Filed: Sep. 18, 2023

(65) Prior Publication Data

US 2024/0304479 A1 Sep. 12, 2024

(30) Foreign Application Priority Data

Mar. 8, 2023 (CN) .......................... 202320439447.3

(51) Int. Cl.
| | |
|---|---|
| *H10P 72/00* | (2026.01) |
| *G01B 5/08* | (2006.01) |
| *G01B 5/12* | (2006.01) |
| *H10P 72/10* | (2026.01) |

(52) U.S. Cl.
CPC ............ *H10P 72/0612* (2026.01); *G01B 5/08* (2013.01); *H10P 72/16* (2026.01); *G01B 5/12* (2013.01)

(58) Field of Classification Search
None
See application file for complete search history.

(56) References Cited

U.S. PATENT DOCUMENTS

2019/0035696 A1* 1/2019 Lin ..................... H10P 72/3314

FOREIGN PATENT DOCUMENTS

CN 112097588 A * 12/2020
WO WO2015113182 A1 * 8/2015

* cited by examiner

*Primary Examiner* — Kaj K Olsen
*Assistant Examiner* — Richard Z. Zhang
(74) *Attorney, Agent, or Firm* — AP3 Law Firm PLLC

(57) ABSTRACT

A method for calibrating a tray shield used for holding a wafer for processing is provided. The tray shield is in a ring shape. The method includes determining whether a first calibration ring is placeable into an inner chamber of the tray shield. When the first calibration ring is placeable into the inner chamber, the tray shield is determined to be usable for wafer processing. The first calibration ring is moved around inside the inner chamber to remove metal particles or burrs on the inner chamber, and thereafter, a wafer is loaded in the inner chamber. When the first calibration ring is not placeable into the inner chamber, the tray shield may be discarded. The method may also include assembling the tray shield utilizing a second calibration ring having an outer diameter equal to an inner diameter of the ring shape.

18 Claims, 7 Drawing Sheets

CALIBRATION DEVICE

CROSS-REFERENCE TO RELATED DISCLOSURES

This patent disclosure claims priority to Chinese Disclosure No. 202320439447.3, filed on Mar. 8, 2023 and entitled "Calibration device," which is hereby incorporated by reference herein as if reproduced in its entirety.

TECHNICAL FIELD

The present disclosure relates to the field of wafer manufacturing, and in particular embodiments, to a calibration device for wafer manufacturing.

BACKGROUND

During the wafer loading process, a Bernoulli arm or gripper places a wafer directly above a tray shield. After the airflow is turned off, the wafer falls in the middle of the tray shield. If there are metal burrs on the tray shield, if the tray shield is not installed in place, or if the size of the tray shield does not match that of the wafer, the wafer may not fall right in the middle of the tray shield. When the tray shield is applied with voltage, electrostatic adsorption occurs, and the wafer is forced to cling to the plane of the tray shield, which causes the wafer to break. The tray shield is generally assembled by equipment personnels manually with screws, and the assembly accuracy is low. The assembled tray shield is unable to meet the requirements for the thin disc production. The quality of the assembly is affected by the equipment personnels' skills of driving screws, and is not controllable. Further, the current methods do not monitor the real size of the inner chamber of the tray shield and the condition of metal particles. When the size of the inner chamber is smaller than a threshold value or metal particles are present, the wafer breakage rate increases rapidly when foreign particles are present on the tray shield, sputtered metal will increase rapidly and form metal particles on the tray shield, resulting in wafer breakage, which, however, and is not able to be detected. In general, the current methods can provide an indirect and inaccurate control, but cannot really monitor the size of the tray shield.

SUMMARY

Technical advantages are generally achieved, by embodiments of this disclosure which describe a calibration device.

An objective of the present disclosure is to provide a calibration device to solve the problem that the current method cannot quickly and accurately assemble and calibrate the tray shield, resulting in the inability to monitor the size of the inner chamber and the sputtered metal particles.

In order to achieve the above objective, the following technical solutions are adopted.

Embodiments of the present disclosure provide a calibration device, including: a first calibration ring, the first calibration ring being used for assembling a tray shield, the tray shield being provided with an inner chamber, and an inner diameter of the inner chamber includes a threshold size; a second calibration ring, the second calibration ring including a second outer diameter D2, the second outer diameter D2 being equal to the threshold size, and the second calibration ring used to calibrate the threshold size.

Optionally, the first calibration ring includes a first outer diameter D1, which satisfies: D1=201.5 mm.

Optionally, the second outer diameter D2 satisfies: D2=200.4 mm~201.5 mm.

Optionally there are a plurality of second outer diameter sizes D2, and the plurality of second outer diameter sizes D2 are arranged in steps.

Optionally, the differences of the plurality of second outer diameter sizes D2 are 0.1 mm to 0.2 mm.

Optionally, the threshold size is 200.5 mm.

Optionally, when the second calibration ring is placed in the inner chamber, the tray shield is used normally; when the second calibration ring cannot be placed in the inner chamber, the tray shield cannot be used.

Optionally, the tray shield includes rings, vanes and fasteners, the rings are arranged in sequence, the vanes are arranged between adjacent rings, the rings and the blades enclose to form inner chambers, and the fasteners are used to tighten the tray shield.

Optionally, the inner diameter of the inner chamber includes an actual size. When the second calibration ring is placed in the inner chamber, the outer circumference of the second calibration ring fits the inner circumference of the ring, and the actual size of the inner chamber is greater than the threshold size of the inner chamber.

Optionally, when the second calibration ring is placed in the inner chamber, the second calibration ring is rotated with respect to the tray shield, and the second calibration ring is used to remove sputtered metal particles produced during wafer preparation using the tray shield.

The beneficial effect of this application is: the calibration device provided by the technical solution of the present disclosure includes a first calibration ring and a second calibration ring. By using the first calibration ring to assemble the tray shield, the tray shield can be assembled quickly and accurately, and the assembly accuracy can be greatly improved. The tray shield is provided with an inner chamber, and the size of the inner diameter of the inner chamber includes a threshold size. The second calibration ring includes a second outer diameter size, and the second outer diameter size is equal to the critical size. The service life of the tray shield is determined by using the second calibration ring. Based on the second calibration ring placeable into the inner chamber, it can be determined that the tray shield can continue to be used for wafer preparation, and based on the second calibration ring unable to be placed into the inner chamber, it can be determined that the size of the inner chamber of the tray shield is smaller than the critical size or the sputtered metal particles exceed a limit, which causes the tray shield to be unable to be used normally and the tray shield is scrapped. This realizes the purpose of using the second calibration ring to calibrate and monitor the critical size of the inner chamber in real time.

According to one aspect of the present disclosure, a method is provided that includes determining whether a first calibration ring is placeable into a first inner chamber of a first tray shield, the first tray shield being configured for wafer processing, and the first tray shield being in a ring shape; in response to the first calibration ring being placeable into the first inner chamber, determining that the first tray shield is usable for the wafer processing; moving around the first calibration ring inside the first inner chamber to remove metal particles or burrs on the first inner chamber; and loading a wafer in the first inner chamber for processing the wafer.

According to another aspect of the present disclosure, a method is provided that includes monitoring usability of a first tray shield for wafer processing based on whether a first calibration ring is placeable into a first inner chamber of the first tray shield, the first tray shield being in a ring shape; when the first calibration ring is placeable into the first inner chamber of the first tray shield, determining that the first tray shield has usability, rotating the first calibration ring inside the first inner chamber to remove metal particles or burrs on the first inner chamber, and loading a wafer into the first inner chamber to process the wafer; and when the first calibration ring is not placeable into the first inner chamber of the first tray shield, discarding the first tray shield.

According to another aspect of the present disclosure, a method is provided that includes detecting that a first calibration ring is placeable into a first inner chamber, a second inner chamber and a third inner chamber of a tray shield, respectively, the first inner chamber, the second inner chamber and the third inner chamber each being in a ring shape, and the tray shield being for wafer processing; moving around the first calibration ring inside the first inner chamber, the second inner chamber and the third inner chamber, respectively, to remove metal particles or burrs on the first inner chamber, the second inner chamber and the third inner chamber; and loading wafers into the first inner chamber, the second inner chamber and the third inner chamber to process the wafers.

BRIEF DESCRIPTION OF THE DRAWINGS

In order to more clearly illustrate technical solutions in embodiments of the present disclosure, drawings in the embodiments of the present disclosure are briefly described in the following. Obviously, the drawings in the following description are only some embodiments of the disclosure, and those skilled in the art may also obtain other drawings based on these drawings without making creative efforts.

The technical solutions and beneficial effects of the present disclosure will be made apparent through the detailed description of embodiments of the present disclosure in conjunction with the accompanying drawings, in which.

Corresponding numerals and symbols in the different FIGs generally refer to corresponding parts unless otherwise indicated. The FIGs are drawn to clearly illustrate the relevant aspects of the embodiments and are not necessarily drawn to scale.

DETAILED DESCRIPTION OF ILLUSTRATIVE EMBODIMENTS

Figure 1:
FIG. 1 is a schematic structural diagram of an example tray shield, which may be assembled and calibrated using an example calibration device according to embodiments of the present disclosure.
Figure 1:
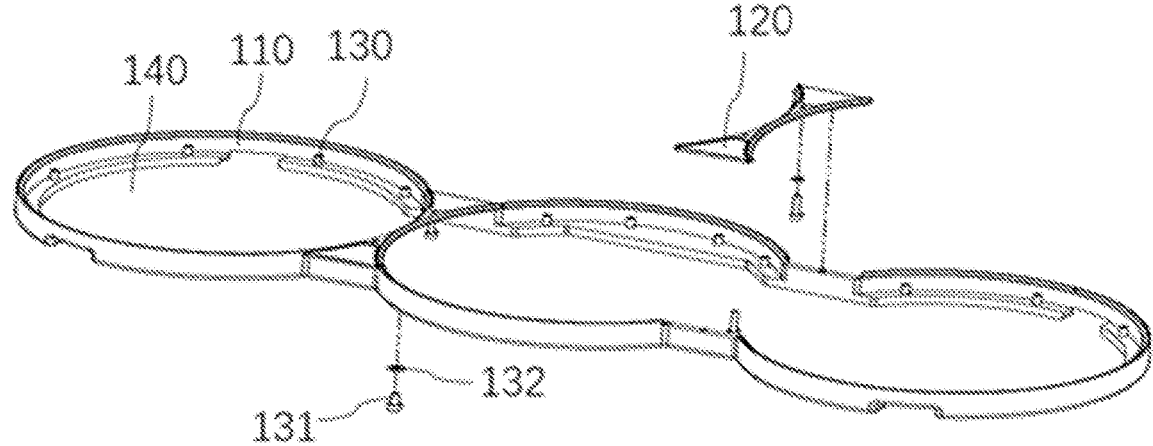
Figure 1:
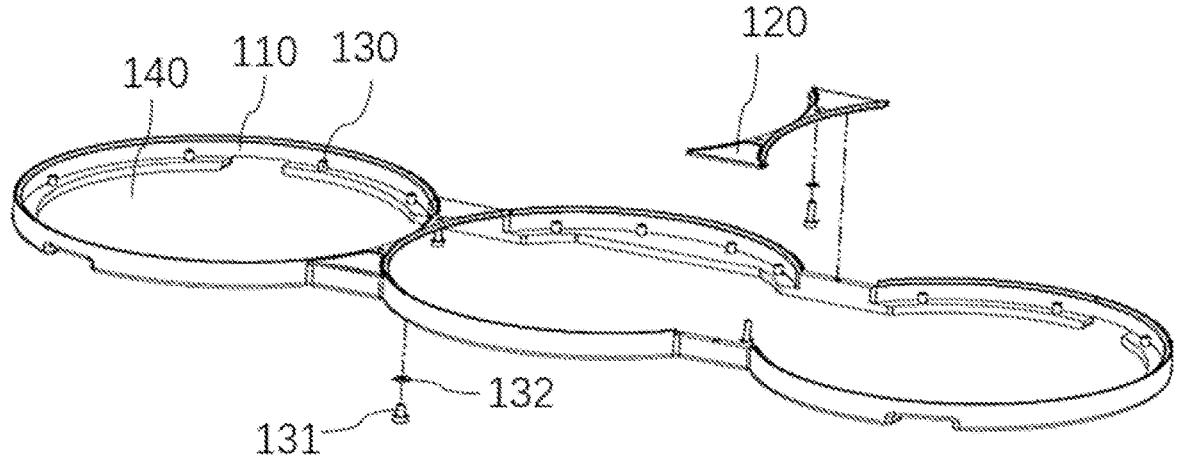

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Embodiments of the present disclosure provide a calibration device, which will be described in the following with reference to the accompanying drawings. However, it should be noted that the implementation of the calibration device is not limited to the following embodiments. The embodiments may be applied for wafer fabrication. Physical Vapor Deposition Referring to FIGS. 1 to 4, an example calibration device is provided according to embodiments of the present disclosure. The calibration device may be used for assembling and calibrating a sputtering tray shield 100 (also referred to as tray shield). The calibration device helps lower the wafer breakage rate in a wafer back-side metallization process of a sputtering machine. The calibration device includes a first calibration ring 200 and a second calibration ring 300. In an embodiment of the present disclosure, the first calibration ring 200 may be used to assemble the tray shield 100, and the tray shield 100 is provided with an inner chamber 140. Wafer may be prepared in the inner chamber 140 by performing metal sputtering using the tray shield 100. The size of the inner diameter of the inner chamber 140A has a threshold size. The second calibration ring 300 has a second outer diameter size D2, and the second outer diameter size D2 is equal to the threshold size set for the inner chamber 140. By setting the second outer diameter size D2 of the second calibration ring 300 to be equal to the threshold size of the inner chamber 140, the second calibration ring 300 can be used to calibrate the inner diameter of the inner chamber 140 with respect to the threshold size.

The calibration device provided in the embodiments of the present disclosure includes the first calibration ring 200 and the second calibration ring 300. By using the first calibration ring 200 to assemble the tray shield 100, the tray shield 100 can be assembled quickly and accurately. The accuracy of assembling the tray shield 1000 is greatly improved. The tray shield 100 has the inner chamber 140, and the size of the inner diameter of the inner chamber 140 includes the threshold size. The second calibration ring 300 has the second outer diameter size D2, and the second outer diameter size D2 is equal to the threshold size. When the second calibration ring 300 can be placed into the inner chamber 140, it is determined that the tray shield 100 may continue to be used for wafer preparation. When the second calibration ring 300 cannot be placed in the inner chamber 140, it is determined that the size of the inner chamber 140 with metal particles formed by metal sputtering is smaller than the threshold size, or the sputtered metal particles exceed a limit to an extent that the tray shield 100 cannot continue to be used normally. Thus, by use of the second calibration ring 300, the service life of the tray shield 100 may be determined, so as to achieve the purpose to calibrate and monitor in real time the size of the inner chamber 140 with respect to the threshold size using the second calibration ring 300.

The tray shield 100 includes rings 110, vanes 120 and fasteners 130. The rings 110 are arranged in sequence, and a vane 120 is arranged between adjacent rings 110. The rings 110 and the vanes 120 are connected to form tangent circles, and the rings 110 and vanes 120 are enclosed to form an inner chamber 140. The fastener 130 includes screws 131 and nuts 132. The fasteners 130 are used to secure the connection between the rings 110 and the vanes 120. The screws 131 match the nuts 132.

Figure 2:
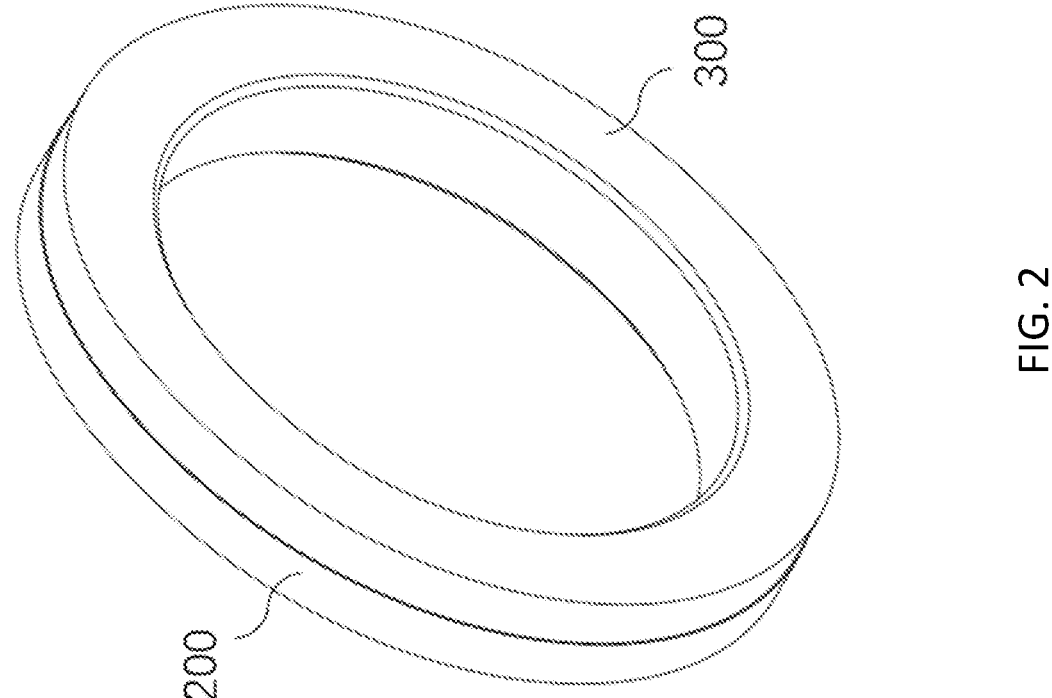
FIG. 2 is a schematic diagram of the example calibration device according to embodiments of the present disclosure.

Conventionally, equipment personnels manually fasten the rings 110 and vanes 120 using the fasteners 130 to assemble the tray shield 100. The operations of fastening the fasteners and equipment accuracy are affecting factors that may result in a poor assembly quality of the tray shield 100, and thus the assembled tray shield 100 cannot meet the requirements of wafer production. The assembly accuracy of the tray shield 100 is also greatly affected by the personnels doing the work. Further, whether the tray shield 100 is deformed cannot be determined by fastening the fasteners. The forgoing factors among others cause the wafer to break easily. In contrast, the embodiments of the present disclosure utilize the first calibration ring 200 to quickly and accurately assemble the tray shield 100, as shown in FIGS. 1 and 2. In an example, by using a first outer diameter size D1 of the first calibration ring 200 as a reference, the shape of the tray shield 100 formed after the fastener 130 is fastened may be fixed. The first calibration ring 200 may be used to fix the tray shield 100 and check whether the tray shield 100 is deformed. By tightening the fasteners 130 with reference to the first calibration ring 200, the assembly efficiency and accuracy of the tray shield 100 can be greatly improved, so that after the tray shield 100 is assembled and before it is used, the size of the inner chamber 140 of the tray shield 100 is more accurate. Experimental data shows that using the first calibration ring 200 to assemble the tray shield 100 can save at least half of the current assembly time. The tray shield 100 can be accurately and quickly assembled, which greatly reduces the assembly time.

Figure 3:
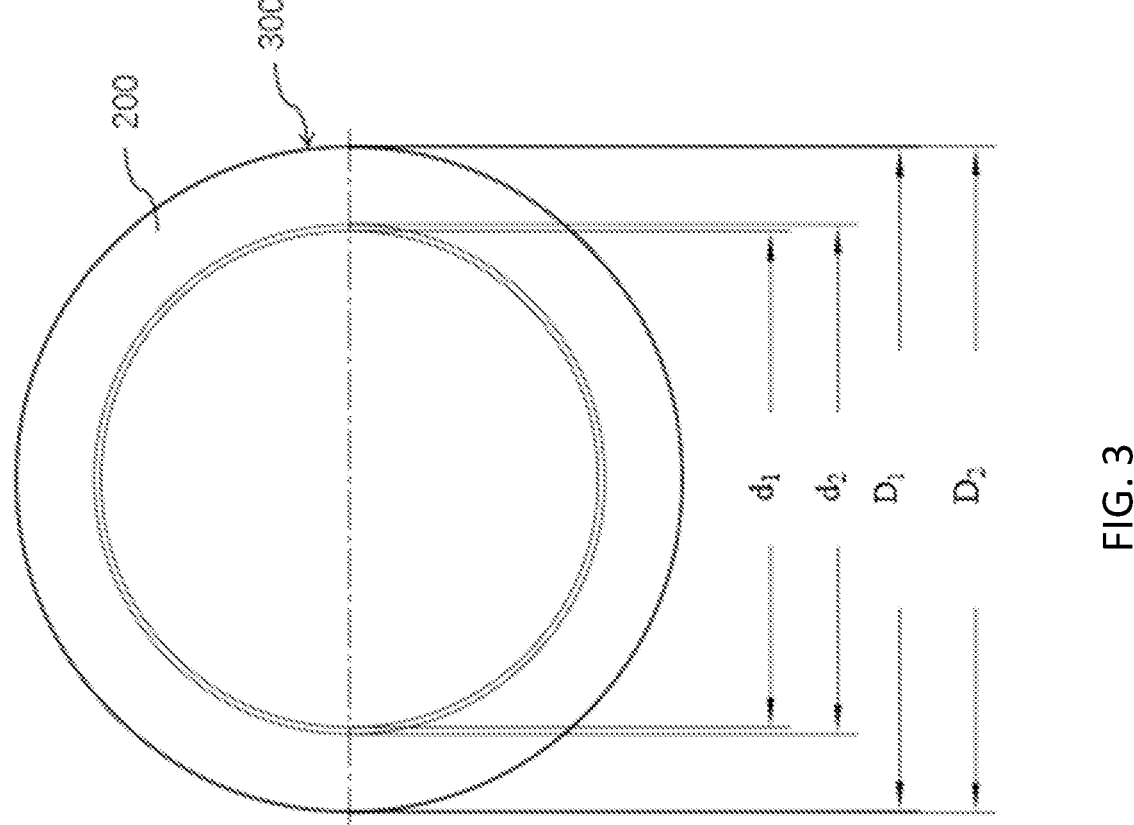
FIG. 3 is a top view of the calibration device in FIG. 2.

In some embodiments of the present disclosure, as shown in FIG. 3, the first calibration ring 200 includes the first outer diameter size D1. In an example, D1=201.5 mm. In another example, D1=201.57 mm.

In addition, as shown in FIG. 3, the first calibration ring 200 and the second calibration ring 300 also include inner diameter dimensions and chamfer dimensions. The inner diameter sizes of the first calibration ring 200 and the second calibration ring 300 are the same, i.e., both are d1. The chamfer dimensions of the first calibration ring 200 and the second calibration ring 300 are the same, and both are d2. In an example, d1=150 mm, d2=154 mm.

Figure 4:
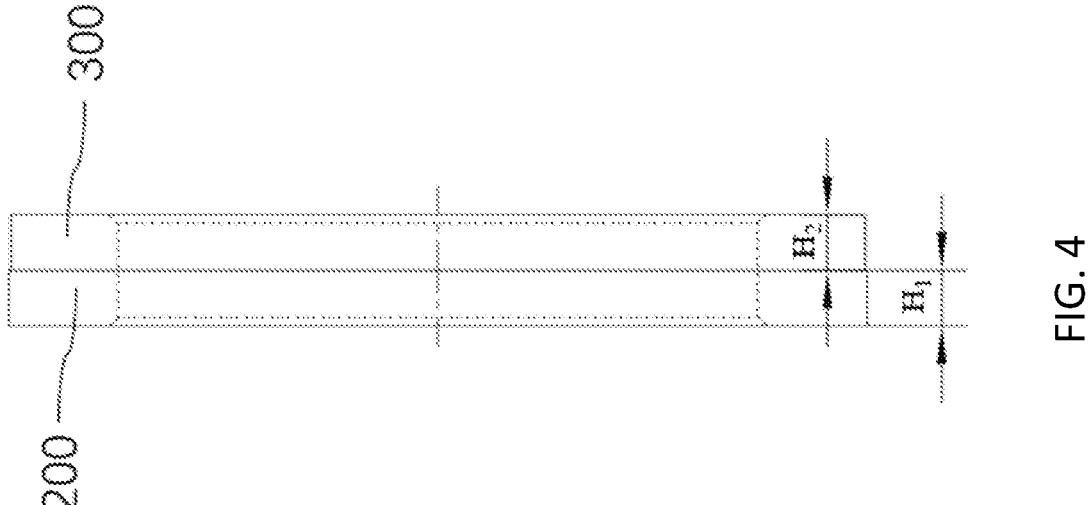
FIG. 4 is side view of the calibration device in FIG. 2.

As shown in FIG. 4, the first calibration ring 200 has a first thickness H1, and the second calibration ring 300 has a second thickness H2. In an example, the first thickness H1 is equal to the second thickness H2, and both are 13 mm.

Further, the size of the inner diameter of the inner chamber 140 may have an actual size. In an example, the first outer diameter size D1 of the first calibration ring 200 is used as a reference to assemble the tray shield 100. After the tray shield 100 is assembled without being used, the actual size of the inner chamber 140 is theoretically equal to the first outer diameter size D1. That is, when D1=201.5 mm, and after the tray shield 100 is assembled and before the metal sputtering process for wafer preparation is performed, the size of the inner chamber 140 is 201.5 mm.

In an embodiment of the present disclosure, the tray shield 100 assembled using the calibration device may be used to prepare a wafer having a size of 200 mm.

In some embodiments of the present disclosure, after the tray shield 100 is used, the inner chamber 140 of the tray shield 100 may be calibrated or monitored by using the second calibration ring 300.

As shown in FIGS. 2 to 4, the size of the inner diameter of the inner chamber 140 may include the actual size and the threshold size. When the assembled tray shield 100 is used to prepare the wafer by metal sputtering, the second calibration ring 300 is used for monitoring the size of the inner diameter of the inner chamber 140 with respect to the threshold size. Specifically, when the second calibration ring 300 can be placed into the inner chamber 140 of the tray shield 100, it can be determined that the tray shield 100 meets the dimension requirements on the inner chamber 140 or meets the requirements about the metal particle condition, and the tray shield 100 can continue to be used and the metal sputtering process can be performed. If the second calibration ring 300 cannot be placed in the inner chamber 140 of the tray shield 100, it indicates that the actual inner diameter size of the inner chamber 140 is smaller than the second outer diameter size D2 of the second calibration ring 300, that is, the actual inner diameter size of the inner chamber 140 is smaller than the threshold size of the inner diameter of the inner chamber 140, which further indicates that the tray shield 100 cannot continue to be used. In this way, the service life of the tray shield 100 may be determined by use of the second calibration ring 300. In view of above, the threshold size of the inner chamber 140 of the tray shield 100 can be actually monitored by using the second calibration ring 300.

In some embodiments, the second calibration ring 300 may also be used to measure the threshold size of the inner chamber 140 of the tray shield 100. As an example, a plurality of second outer diameter sizes D2 of the second calibration rings 300 may be set as an arithmetic sequence in an range from 200.4 mm to 201.5 mm, and the difference of the arithmetic sequence can be selected from a range of 0.1 mm~0.2 mm. For example, the following values in the arithmetic sequence can be selected as the dimensions of the second calibration rings 300, including: 200.4 mm, 200.5 mm, 200.6 mm, 200.7 mm, 200.8 mm, . . . , 201.5 mm, where the difference is 0.1 mm. By selecting the second calibration rings 300 of different sizes to compare one-by-one with the threshold size of the inner chamber 140, the threshold size of the inner chamber 140 can be measured by using the second calibration rings 300.

In some embodiments of the present disclosure, the threshold size of the inner chamber 140 is 200.5 mm. The second outer diameter size D2 of the second calibration ring 300 is 200.5 mm. In another example, D2=201.57 mm.

In some other embodiments, when the second calibration ring 300 is placed in the inner chamber 140, the outer circumference of the second calibration ring 300 fits the inner circumference of the ring 110, indicating that the tray shield 100 is within the life span of its normal use, and the actual size of the inner chamber 140 is greater than the threshold size of the inner chamber 140. The tray shield 100 will sputter and produce a large number of metal particles during the normal sputtering process, the metal particles in the inner chamber 140 of the tray shield 100 may be removed by rotating the calibration ring 300 in the inner chamber 140. Thus, the second calibration ring 300 can be used to remove the metal burrs on the tray shield 100, which can, to a certain extent, slow down the rate at which the actual size of the inner chamber 140 reaches the threshold size when the tray shield 100 is in use. This is equivalent to increasing the service life of the tray shield 100.

It should be noted that, during the use of the tray shield 100, the size of the inner chamber 140 decreases and metal particle epitaxy occurs due to the metal sputtering, which is conventionally and generally monitored by monitoring the sputtering amount of the target or setting fixed time, or by setting equipment software specifications, and regular cleaning, etc. In the actual production process of metal sputtering, not all the sputtering of the target will be sputtered on the tray shield 100, and thus the thickness of the sputtered metal on the tray shield 100 is uncontrollable. When there are foreign particles on the sputtered metal, the sputtered metal will increase rapidly to form metal particles, resulting in wafer breakage, and the equipment cannot directly monitor the size of the inner chamber 140. Therefore, the current methods can only indirectly and roughly monitor the size of the inner chamber 140 and the condition of the metal particles, but cannot accurately monitor the actual size of the inner chamber 140. Consequently, when the actual size of the inner diameter of the inner chamber 140 is close to or even smaller than the threshold size, or when metal particles are present, the wafer breakage rate increases quickly. By use of the second calibration ring 300, the threshold size of the inner chamber 140 of the tray shield 100 can be monitored, and the metal particles on the tray shield 100 can be removed by rotating or shifting the second calibration ring 300 in the inner chamber 140. The embodiments thus can effectively reduce the wafer breakage rate when the actual size of the inner chamber 140 is smaller than the threshold size or when a large number of metal particles are present.

An embodiment method of assembling and using the embodiment calibration device of the present disclosure is described in the following.

Figure 5:
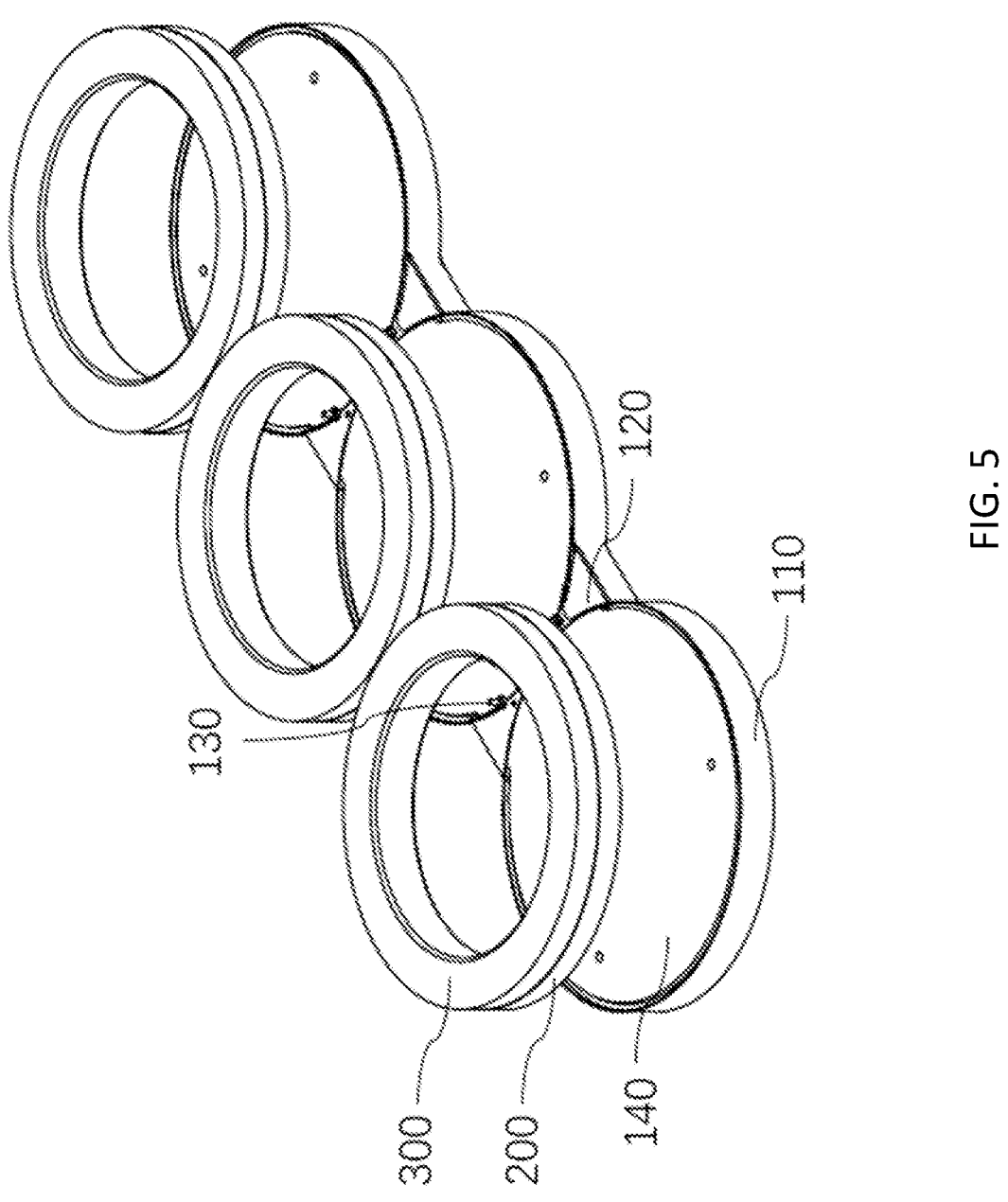
FIG. 5 is a schematic diagram showing assembly of the tray shield using a first calibration ring according to embodiments of the present disclosure.

As shown in FIG. 5, the first calibration ring 200 is utilized to assemble the tray shield 100. The first calibration ring 200 is fixed to the tray shield 100, and the fasteners 130 are installed on the rings 110 and vanes 120 of the tray shield 100 and then tightened to ensure the assembly accuracy of the tray shield 100.

Figure 6:
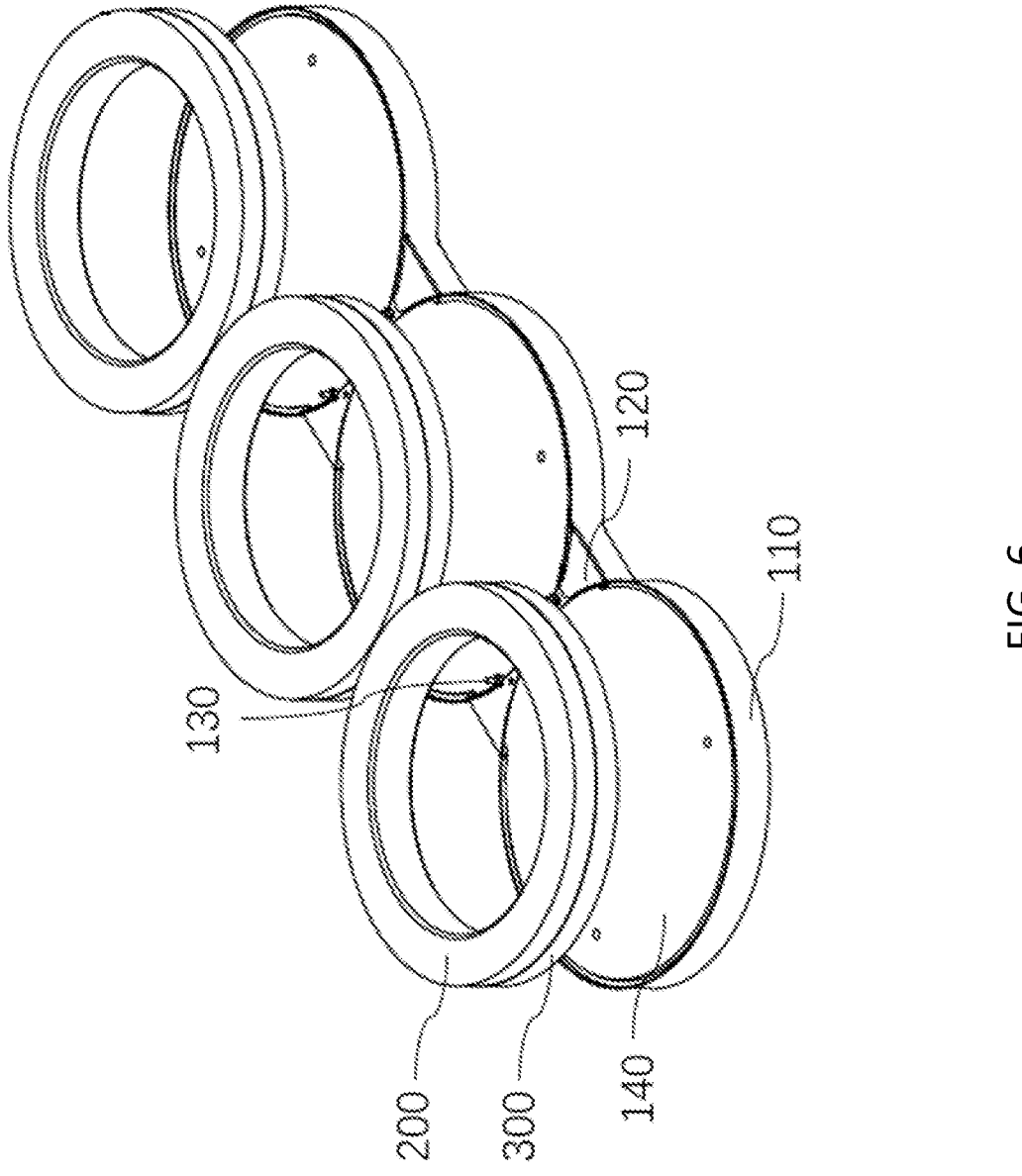
FIG. 6 is a schematic diagram showing monitoring the size of the tray shield using a second calibration ring according to embodiments of the present disclosure.

As shown in FIG. 6, after the tray shield 100 is fixed, the first calibration ring 200 and the second calibration ring 300 are flipped, and the second calibration ring 300 is placed into the inner chamber 140 of the tray shield 100, to determine whether the second calibration ring 300 can be placed in the inner chamber 140. If the second calibration ring 300 cannot be placed, it indicates that the actual size of the inner chamber 140 of the tray shield 100 is smaller than the threshold size, and the tray shield 100 cannot continue to be used. If the second calibration ring 300 can be placed into the inner chamber 140 of the tray shield 100, it means that the actual size of the inner chamber 140 of the tray shield 100 is larger than the threshold size, and the tray shield 100 can continue to be used. In addition, by rotating the second calibration ring 300 in the inner chamber 140 of the tray shield 100, the rotation of the second calibration ring 300 can be used to remove the metal particles produced during wafer preparation utilizing the tray shield 100.

The calibration device provided by the embodiments of the present disclosure can be used to fix the tray shield 100 and check whether the tray shield 100 is deformed by using the first calibration ring 200, and to assemble the tray shield 100 by tightening the fasteners 130, which can save a lot of assembly time, and improve the assembly efficiency and accuracy of the tray shield 100, thereby realizing the assembly and positioning of the tray shield 100 by using the first calibration ring 200. By use of the second calibration ring 300 that can be placed into the inner chamber 140, it is determined that the tray shield 100 can continue to be used, and by use of the second calibration ring 300 that cannot be placed in the inner chamber 140, it can be determined that the tray shield 100 cannot continue to be used, which realizes the calibration of the threshold size of the inner chamber of the tray shield 100, and realizes the monitoring of the life of the tray shield 100. By configuring a plurality of the second calibrating rings 300 with different second outer diameter sizes D2 in an arithmetic sequence, and by performing comparison using the second outer diameter sizes D2 that have values in the arithmetic sequence, measuring the threshold size of the inner chamber 140 of the tray shield 100 is achieved. In addition, by rotating and/or shifting the second calibration ring 300 in the inner chamber 140 to remove the metal particles in the inner chamber 140 of the tray shield 100, the service life of the tray shield 100 is increased.

According to an embodiment of the present disclosure, a calibration device is provided that includes a first calibration ring (200) used to assemble a tray shield (100), the tray shield (100) is provided with an inner chamber (140), and the inner diameter of the inner chamber (140) includes a threshold size; a second calibration ring (300) including a second outer diameter D2, the second outer diameter D2 is equal to the threshold size, and the second calibration ring (300) is used for calibrating the threshold size.

According to an embodiment of the present disclosure, the first calibration ring (200) includes a first outer diameter D1, which satisfies: D1=201.5 mm.

According to an embodiment of the present disclosure, the second outer diameter D2 satisfies: D2=200.4 mm~201.5 mm.

According to an embodiment of the present disclosure, there are a plurality of second outer diameter sizes D2, and the plurality of second outer diameter sizes D2 have values in a pattern of an arithmetic sequence.

According to an embodiment of the present disclosure, the difference of the arithmetic sequence is 0.1 mm~0.2 mm.

According to an embodiment of the present disclosure, the threshold size is 200.5 mm.

According to an embodiment of the present disclosure, when the second calibration ring (300) is placed in the inner chamber (140), the tray field (100) is in normal use; when the second calibration ring (300) cannot be placed in the inner chamber (140), the tray shield (100) cannot be used.

According to an embodiment of the present disclosure, the tray field (100) comprises rings (110), vanes (120) and fasteners (130), the rings (110) are arranged in sequence, the vanes (120) are arranged between adjacent rings (110), the rings (110) and the vanes (120) are enclosed to form the inner chamber (140), and the fastener (130) are used to lock the tray field (100).

According to an embodiment of the present disclosure, the inner diameter of the inner chamber (140) further includes an actual size, when the second calibration ring (300) is placed in the inner chamber (140), the outer circumference of the second calibration ring (300) fits with the inner circumference of a ring (110), and the actual size of the inner chamber (140) is greater than the threshold size of the inner chamber (140).

According to an embodiment of the present disclosure, when the second calibration ring (300) is placed in the inner chamber (140), the second calibration ring (300) is rotated in cooperation with the ring (110), and the second calibration ring (300) is used to remove metal particles generated when the tray shield (100) is used to prepare a wafer.

The tray shield 100 may include one or more rings 110, each of which has an inner chamber 140. In an embodiment, the tray shield 100 may include only one ring 110 assembled using the first calibration ring 200 and fastened using the fastener(s) 130. As an example, the first calibration ring 200 is placed inside the ring 110 so that the ring 110 surrounds the first calibration ring 200. The fastener(s) 130 are then put on the ring 110 and fastened (e.g., by driving the screw(s) 131 through the nut(s) 132) to an extent such that the inner diameter of the ring 110 is approximately equal to the outer diameter of the calibration ring 200. Ideally, the inner diameter of the ring 110 is equal to the outer diameter of the calibration ring 200.

In an embodiment, the tray shield 100 may include three rings 110 as shown in FIG. 1 and FIG. 5. As an example, the three rings 110 are a first ring 110, a second ring 110 and a third ring 110, which may be viewed as respectively corresponding to a first tray shield, a second tray shield and a third tray shield having respective inner chambers. The first, second and third tray shields are assembled using the first calibration ring 200, connected through the vanes 120, and fastened using the fastener(s) 130. The first, second and third tray shields are aligned along a same centerline of the rings 110. Each vane 120 includes two sides, through which two adjacent rings 110 are connected or fastened. Each of the two sides of the vane 120 has a shape of an arc of the ring 100 such that the vane 120 partially surrounds the ring 100 for a smooth connection of the ring 100 and the vane 120. In an example, the first calibration ring 200 is placed inside the inner chamber of the first ring 110 (first tray shield) so that the first ring 110 surrounds the first calibration ring 200. The fastener(s) 130 are then put on the first ring 110 and a first vane 120 to connect and fasten the first ring 110 and the first vane 120. Then the first calibration ring 200 is placed inside the inner chamber of the second ring 110 (second tray shield) so that the second ring 110 surrounds the first calibration ring 200. The fastener(s) 130 are then put on the second ring 110 and the first vane 120 to connect and fasten the second ring 110 and the first vane 120. Similarly, the first calibration ring 200 is placed inside the inner chamber of the third ring 110 (third tray shield) so that the third ring 110 surrounds the first calibration ring 200. The fastener(s) 130 are then put on the third ring 110 and a second vane 120 to connect and fasten the third ring 110 and the second vane 120. In this way, the first, second and third tray shields are assembled together using the first calibration ring 200.

The first calibration ring 200 and the second calibration 300 may be separate rings, or may be integrated as one calibration device as shown in FIG. 2. That is, one side of the first calibration ring 200 is connected to one side of the second calibration 300. As described above, the outer diameter of the second calibration 300 may be smaller than or equal to the outer diameter of the first calibration 200. The first calibration ring 200 and the second calibration 300 may have the same thickness or different thicknesses, where the respective thicknesses H1 and H2 are shown in FIG. 4. When the first calibration ring 200 and the second calibration 300 are integrated as a calibration device, the calibration device may be flipped (e.g., up-down) in order to use the first calibration ring 200 or the second calibration 300.

In some embodiments, the second calibration ring 300 may be used to monitor the usability of the tray shield. The second calibration ring 300 may be used to determine whether the tray shield is usable of not for wafer processing, e.g., wafer preparation, performing back-side metallization, or sputtering. The monitoring of the usability of the tray shield may be performed each time before loading wafer(s) in the tray shield, at a fixed time, at a configurable frequency, when a control signal is received for performing the monitoring, and/or in other applicable ways.

Figure 7:
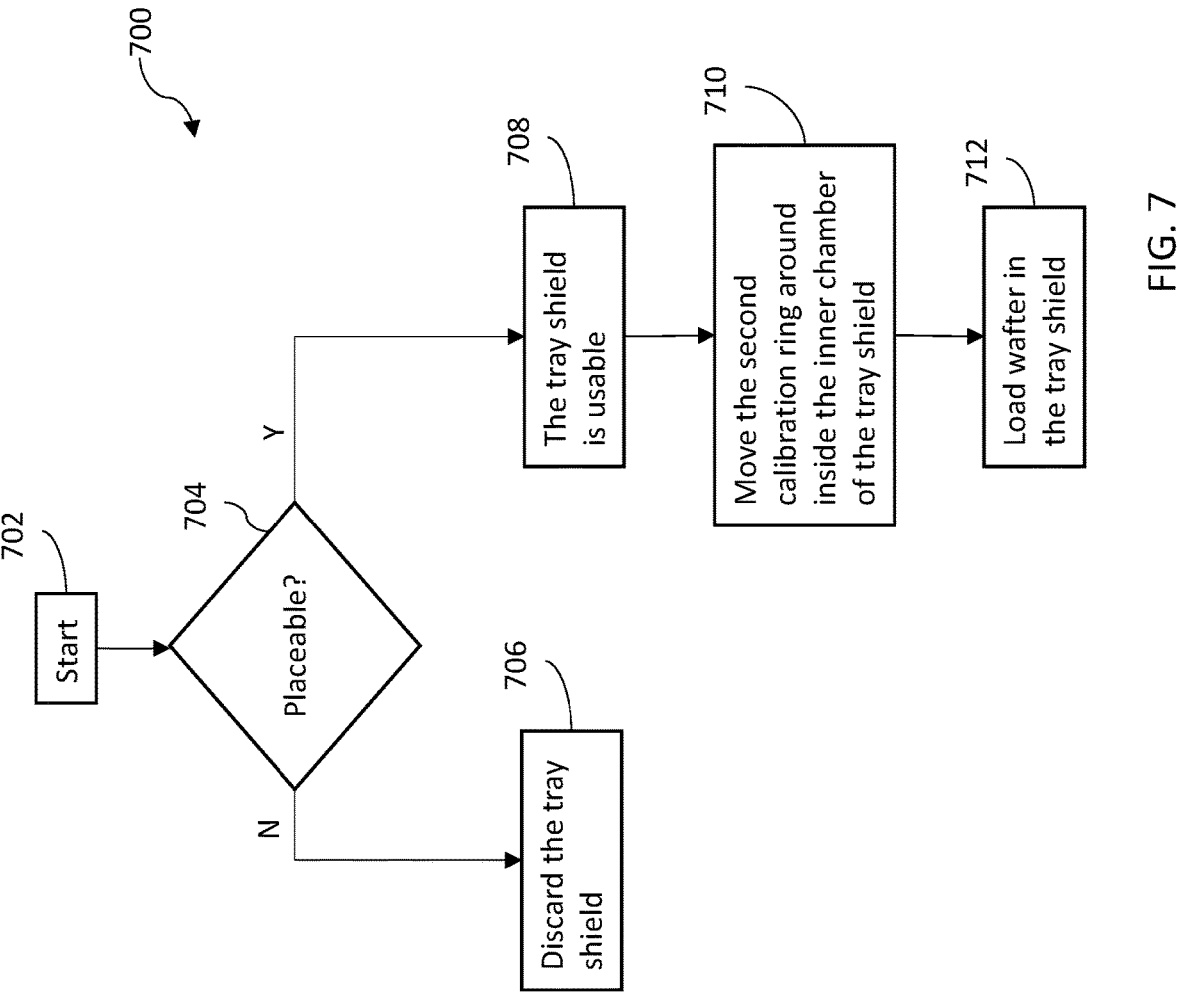
FIG. 7 is a flowchart of an example method for monitoring usability of a tray shield according to embodiments of the present disclosure.

FIG. 7 is a flowchart of an example method 700 for monitoring the usability of a tray shield according to embodiments of the present disclosure. The method 700 starts with step 702 to monitor the usability of the tray shield utilizing the second calibration ring. When monitoring the usability of the tray shield, an attempt may be made to place the second calibration ring 300 into an inner chamber 140 of the tray shield to determine whether the second calibration ring 300 is placeable into the inner chamber 140 of the tray shield (step 704). In response to the second calibration ring 300 being not placeable into the inner chamber 140, it is determined that the tray shield is not usable, and is discarded (step 706). A first signal may be generated indicating that the tray shield is not usable any longer and needs to be discarded. As an example, the tray shield may be removed out of a physical vapor deposition (PVD) chamber and discarded. In response to the second calibration ring 300 being placeable into the inner chamber, it is determined that the tray shield is still usable for wafer processing (step 708). A second signal may be generated indicating that the tray shield is still usable for wafer processing.

A clean-up of the tray shield may be performed after determining that the tray shield is still usable for wafer processing. The clean-up may be triggered by the second signal. To clean up the tray shield, as examples, the second calibration ring 300 may be moved around inside the inner chamber of the tray shield (step 710), in order to remove possible metal particles or burrs on the inner chamber, e.g., resulted from the sputtering process. Moving the second calibration ring 300 around inside the inner chamber of the tray shield may include rotating the second calibration ring 300 inside the inner chamber, shifting the second calibration ring 300 from side to side inside the inner chamber, moving up and down the second calibration ring 300 inside the inner chamber, any combination thereof, or any other possible movements and combinations, in order to remove the metal particles or burrs. This helps clean up the inner chamber, and avoid or slow down the accumulation of the metal particles or burrs on the inner chamber. After the clean-up, the second calibration ring 300 may be taken out from the inner chamber of the tray shield, and the tray shield is ready for wafer processing. A wafer may be loaded in the tray shield for processing (step 712).

The method 700 may be performed in a wafer processing/preparation machine or equipment, such as a PVD chamber. A controller may be provided to monitor the usability of the tray shield and generate the related signals.

The tray shield includes more than one inner chamber 140, i.e., more than one tray shield 100 as shown FIG. 1, FIG. 5 and FIG. 6 (including three inner chambers 140, thus three tray shields), and the method 700 may be performed for each of the inner chambers, with changes made to some steps to the method 700. Various embodiments may be possible. As an example, when detecting that one or more of the three tray shields are not usable, the three tray shields are all discarded. As another example, when detecting that one or two of the three tray shields are not usable, the one or two non-usable tray shields may be replaced by usable ones and connected to the remaining usable tray shield(s). When a tray shield is determined to be usable by utilizing the second calibration ring 300, the clean-up is performed to the usable tray shield, and then the second calibration ring 300 is used to detect the next tray shield. When determining that the three tray shields are all usable (including replacing one(s)) and the clean-up is done, wafers may be loaded in the three tray shields for processing. Those of ordinary skill in the art would recognize various changes and modifications may be made to the method 700 according to the various embodiments described above and any other possible variations.

Figure 8:
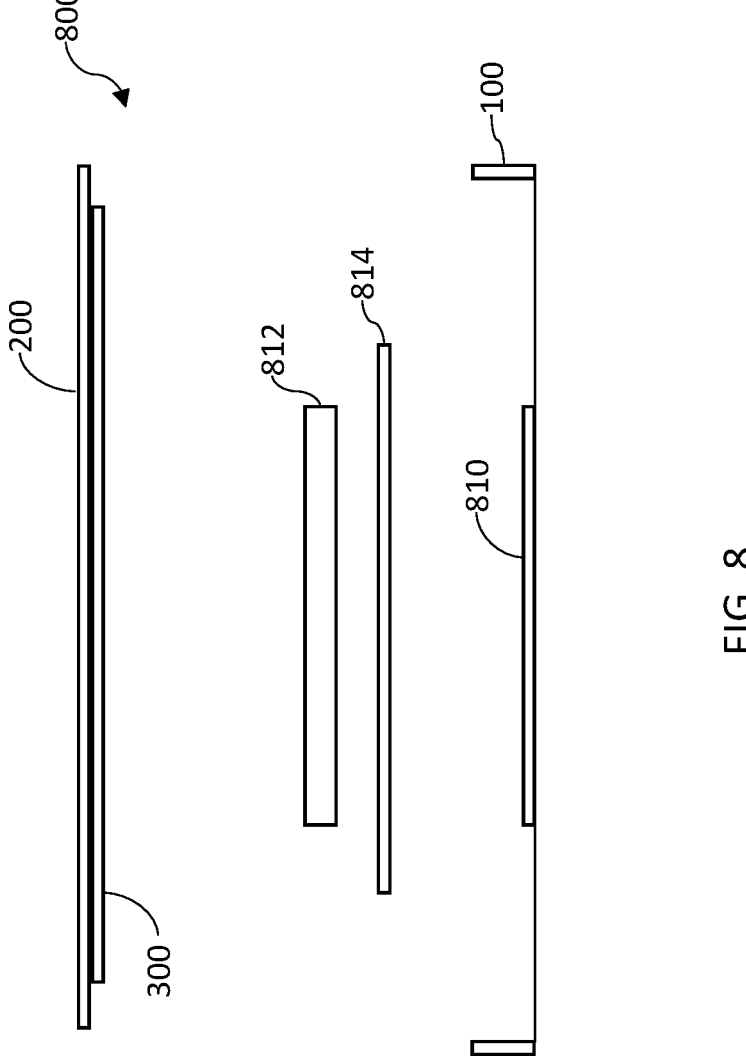
FIG. 8 is a schematic diagram of an example structure for wafer processing.

The calibration device, or the first calibration ring 300 and/or the second calibration ring 300, may be placed in a wafer processing/preparation machine or equipment, such as a PVD chamber. FIG. 8 is a schematic diagram of an example structure 800 for wafer processing, highlighting positioning of the first calibration ring 200 and the second calibration ring 300. The structure 800 may be in a PVD chamber. The structure 800 includes a tray shield 100, with an electrostatic chuck (ESC) pad 810 placed in the inner chamber of the tray shield for holding a wafer during wafer processing. A Bernoulli arm 812 may hold a wafer 814 above the tray shield 100, and load the wafer 814 into the inner chamber of the tray shield 100. The second calibration ring 300 may be held directly above the Bernoulli arm 812, the wafer 814 and the tray shield 100, as an example. The second calibration ring 300 may be held above using various applicable holding mechanisms/methods, e.g., gripped by a mechanical arm, held by a magnetic arm, and so on. When the second calibration ring 300 is to be used to detect the usability of the tray shield 100, the second calibration ring 300 may be lowered down to determine whether it can be placed in the inner chamber of the tray shield 100. When the detection is completed, the second calibration ring 300 may be lifted up and placed in its place. The holding mechanism to hold the second calibration ring 300 may also be configured to perform clean-up to the tray shield 100 using the second calibration ring 300. For example, when the second calibration ring 300 is lowered down into the inner chamber of the tray shield 100, the holding mechanism may be configured to rotate the second calibration ring 300 in the inner chamber of the tray shield 100, to shift the second calibration ring 300 whiling rotating the second calibration ring 300, or to move the second calibration ring 300 up and down while rotating the second calibration ring 300, and so on. Those of ordinary skill in the art would recognize various mechanisms to hold the second calibration ring 300, to lower down and lift up the second calibration ring 300, and to move the second calibration ring 300 inside the inner chamber of the tray shield 100.

In some embodiments, optionally, the structure 800 may also include the first calibration ring 200 integrated with the second calibration ring 300, as an integrated calibration device as shown in FIG. 2. When the first calibration ring 200 is to be used, the holding mechanism holding the calibration device may flip the calibration device so that the first calibration ring 200 is beneath the second calibration ring 300. The holding mechanism may then lower down the calibration device into the tray shield 100, and the first calibration ring 200 is used for assemble the tray shield 100.

The above description merely provide example embodiments of the calibration device of the present disclosure. It should be pointed out that for those of ordinary skill in the art, changes and modifications may be made without departing from the principle of the present disclosure. These changes and modifications should also be regarded as within the scope of protection of the present disclosure.

The terms "first" and "second" are used for descriptive purposes only, and should not be interpreted as indicating or implying relative importance or as implicitly specifying a quantity of indicated technical features. Thus, a feature limited with "first" or "second" may explicitly indicate or implicitly include one or more of the features.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
providing a first calibration ring that is placeable into a first inner chamber of a first tray shield, the first tray shield being configured for wafer processing, and the first tray shield being in a ring shape;
moving around the first calibration ring inside the first inner chamber to remove metal particles or burrs on the first inner chamber; and
loading a wafer in the first inner chamber for processing the wafer.

2. The method of claim 1, further comprising:
determining that an inner diameter of the first inner chamber has a size that is smaller than a threshold size set for the first tray shield.

3. The method of claim 2, wherein an inner diameter of the ring shape is 201.5 mm, and the threshold size is 200.5 mm.

4. The method of claim 1, wherein an inner diameter of the ring shape is 201.5 mm, an outer diameter of the first calibration ring is in a range of 200.4 mm to 201.5 mm, and the wafer has a size of 200 mm.

5. The method of claim 1, further comprising:
assembling the first tray shield utilizing a second calibration ring, an outer diameter of the second calibration ring being equal to an inner diameter of the ring shape.

6. The method of claim 1, further comprising:
connecting the first tray shield with a second tray shield through a first vane, by fastening, respectively, the first tray shield and the second tray shield to the first vane via a first fastener and a second fastener.

7. The method of claim 6, further comprising:
in response to the first calibration ring being placeable into a second inner chamber of the second tray shield, determining that the second tray shield is usable for the wafer processing; and
moving around the first calibration ring inside the second inner chamber to remove metal particles or burrs on the second inner chamber.

8. The method of claim 6, further comprising:
connecting the second tray shield with a third tray shield through a second vane, by fastening, respectively, the second tray shield and the third tray shield to the second vane via a third fastener and a fourth fastener, and the first tray shield, the second tray shield and the third tray shield being connected in sequence.

9. The method of claim 8, further comprising:
in response to the first calibration ring being placeable into a third inner chamber of the third tray shield, determining that the third tray shield is usable for the wafer processing; and
moving around the first calibration ring inside the third inner chamber to remove metal particles or burrs on the third inner chamber.

10. The method of claim 9, further comprising:
in response to the first calibration ring being not placeable into a second inner chamber of the second tray shield or the third inner chamber of the third tray shield, discarding the second tray shield and the third tray shield.

11. The method of claim 1, wherein moving around the first calibration ring inside the first inner chamber comprising:

shifting side by side the first calibration ring while rotating the first calibration ring inside the first inner chamber.

12. The method of claim 1, wherein moving around the first calibration ring inside the first inner chamber comprising:

moving up and down the first calibration ring while rotating the first calibration ring inside the first inner chamber.

13. A method comprising:

providing a first tray shield that is usable, the first tray shield having a first inner chamber into which a first calibration ring is placeable, and the first tray shield being in a ring shape;

rotating the first calibration ring inside the first inner chamber to remove metal particles or burrs on the first inner chamber; and loading a wafer into the first inner chamber to process the wafer.

14. The method of claim 13, wherein an inner diameter of the ring shape is 201.5 mm, an outer diameter of the first calibration ring is in a range of 200.4 mm to 201.5 mm, and the wafer has a size of 200 mm.

15. The method of claim 13, further comprising:

assembling the first tray shield utilizing a second calibration ring, an outer diameter of the second calibration ring being equal to an inner diameter of the ring shape.

16. The method of claim 13, further comprising:

connecting the first tray shield to a second tray shield through a first vane, by fastening, respectively, the first tray shield and the second tray shield to the first vane via a first fastener and a second fastener.

17. The method of claim 16, further comprising:

monitoring usability of the second tray shield for wafer processing by detecting whether the first calibration ring is placeable into a second inner chamber of the second tray shield.

18. A method comprising:

detecting that a first calibration ring is placeable into a first inner chamber, a second inner chamber and a third inner chamber of a tray shield, respectively, the first inner chamber, the second inner chamber and the third inner chamber each being in a ring shape, and the tray shield being for wafer processing;

moving around the first calibration ring inside the first inner chamber, the second inner chamber and the third inner chamber, respectively, to remove metal particles or burrs on the first inner chamber, the second inner chamber and the third inner chamber; and loading wafers into the first inner chamber, the second inner chamber and the third inner chamber to process the wafers.

* * * * *